United States Patent [19]

Perlman

[11] 3,715,686

[45] Feb. 6, 1973

[54] PAIRED NONLINEAR ACTIVE ELEMENTS IN A WAVEGUIDE CAVITY ADAPTED TO SUPPORT ORTHOGONAL TE MODE WAVES AND TE MODE WAVES

[75] Inventor: Barry Stuart Perlman, Hightstown, N.J.

[73] Assignee: RCA Corporation, New York, N.Y.

[22] Filed: March 31, 1971

[21] Appl. No.: 129,807

[52] U.S. Cl. ..............331/96, 331/107 R, 331/107 G

[51] Int. Cl. ..............H03b 7/14

[58] Field of Search ........331/52, 56, 96, 101, 107 R, 331/107 G, 107 T; 330/5, 34, 61 A

[56] References Cited

UNITED STATES PATENTS 3,571,750 3/1971 Carlson et al. ....................331/56 X 3,509,478 4/1970 Thim ..............................331/101 X 3,231,831 1/1966 Hines ..............................331/96

*Primary Examiner*—Roy Lake

*Assistant Examiner*—Siegfried H. Grimm

*Attorney*—Edward J. Norton

[57] ABSTRACT

A pair of nonlinear semiconductive active devices are located in a cavity dimensioned to support electromagnetic waves at the desired fundamental frequency in the $TE_{10}$ mode. The cavity is further dimensioned to support electromagnetic waves in the $TE_{01}$ mode at the second harmonic of the fundamental frequency. Coupling irises are arranged to couple out of the cavity either the $TE_{10}$ mode waves or the $TE_{01}$ mode waves.

7 Claims, 6 Drawing Figures

PATENTED FEB 6 1973 3,715,686

INVENTOR.
BARRY STUART PERLMAN
BY Robert L. Troike
ATTORNEY

PAIRED NONLINEAR ACTIVE ELEMENTS IN A WAVEGUIDE CAVITY ADAPTED TO SUPPORT ORTHOGONAL $TE_{10}$ MODE WAVES AND $TE_{01}$ MODE WAVES

The invention herein described was made in the course of or under a contract or subcontract thereunder with the Department of the Army.

Oscillators and amplifiers using nonlinear semiconductive devices such as transferred electron devices and avalanche diode devices are known. Single avalanche diode devices and single transferred electron devices are not capable of generating the amount of microwave energy desired for all applications. Such devices have been used either in series or in parallel in order to increase the available output power from the microwave oscillator or amplifier.

The nonlinear semiconductive active devices when placed in a resonant cavity structure not only operate at a fundamental frequency as determined in part by the cavity dimensions, but also operate at the even and odd harmonics of that fundamental frequency. This operation of the devices at the second and other harmonics, for example, reduces the efficiency of conversion of the supplied d.c. to the desired operating frequency wave energy. Recently, single devices with separate filters with remote tuning elements following the filters have been used to isolate the undesired harmonic frequencies. Due to the remoteness of the tuning elements associated with such an arrangement, slight changes in the tuning elements cause large impedance changes at the device and consequently difficulties follow in operating the device at the desired frequency with the most efficient conversion.

It is therefore desirable to provide an efficient approach for increasing the available output power from the devices and for the local tuning thereof without separate remote filters. This improved operation is achieved by providing a microwave cavity designed to support electromagnetic signal waves at a first given frequency in a first given mode and to support electromagnetic signal waves at an even harmonic frequency of the given frequency in a mode orthogonal to said given mode. A pair of negative resistance, nonlinear semiconductive devices are mounted within the cavity and extend from opposite walls of the cavity in a plane transverse to the direction of propagation of the electromagnetic energy. The manner in which these devices are placed in the cavity and are biased causes excitation of electromagnetic signal waves at the given frequency in the first mode and excitation of electromagnetic signal waves at the even harmonic frequency in the orthogonal mode. The electromagnetic signal waves at one of the frequencies in one of the modes can be reactively terminated, and electromagnetic signal waves at the other of the frequencies in the other of the modes can be resistively coupled out of the cavity.

Figure 1:
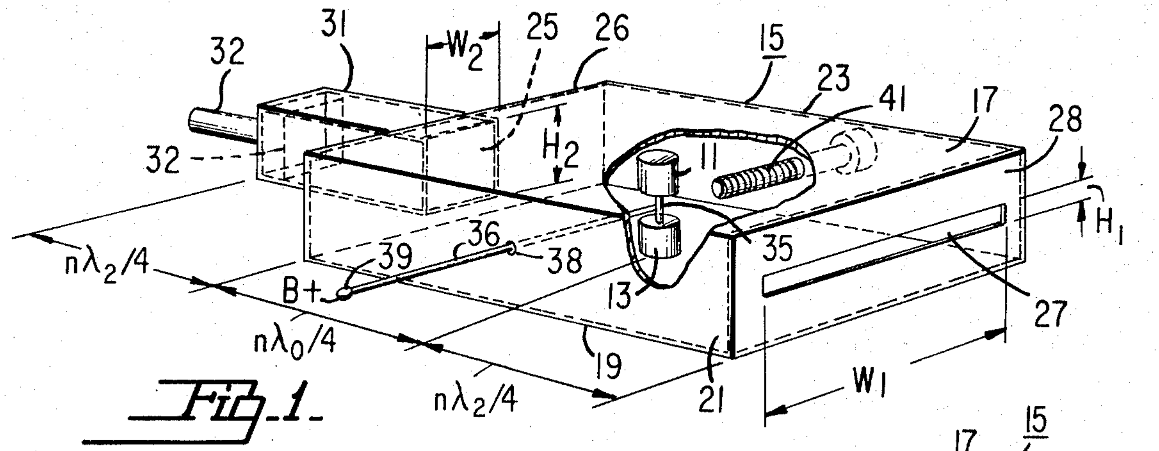
Figure 2:
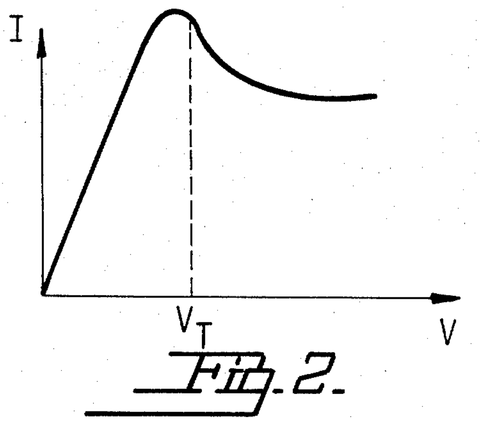
Figure 3:
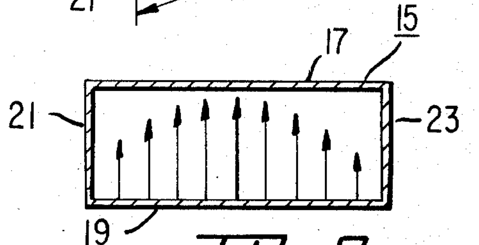
Figure 4:
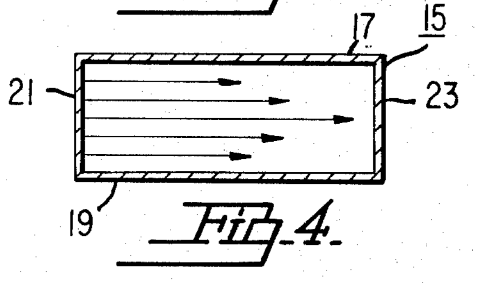
Figure 5:
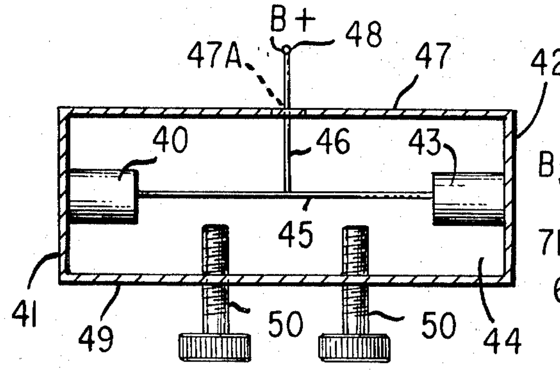
Figure 6:
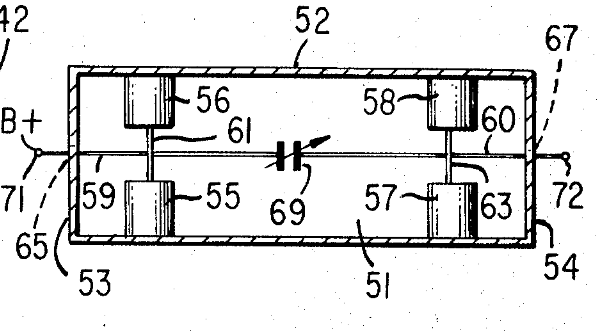

A further understanding of this invention may be had with reference to the following drawings:

FIG. 1 is a perspective view of a waveguide cavity including a series-coupled pair of active devices, FIG. 2 is a typical d.c. current (I) vs. d.c. voltage (V) curve for a bulk effect, transferred electron device in the circuit of the disclosed invention, FIG. 3 is a cross-sectional view of a rectangular waveguide depicting the electric field of the $TE_{10}$ mode, FIG. 4 is a cross-sectional view of a rectangular waveguide depicting the electric field of the $TE_{01}$ mode, FIG. 5 is a cross-sectional sketch of a rectangular waveguide with a parallel-coupled pair of nonlinear active devices, and FIG. 6 is a cross-sectional sketch of a rectangular waveguide with a series-coupled pair and a parallel-coupled pair of nonlinear active devices.

Referring to FIG. 1, there is illustrated a pair of nonlinear, semiconductor active devices 11 and 13 located in a rectangular waveguide cavity 15. The cavity 15 includes broad walls 17 and 19 and narrow walls 21 and 23. The active, nonlinear, semiconductive devices 11 and 13 may be, for example, transferred electron devices of the type using bulk Gallium Arsenide or other III–V compounds or II–VI compounds as found on the Periodic Chart.

When such bulk material has a direct current (d.c.) electric field thereacross that exceeds a given threshold, such as about 3 kilovolts per centimeter, for example, the drift velocity of the electrons as a function electric field decreases. A transfer of electrons from a high velocity state to a low velocity state takes place in a relatively short time compared to the frequency of the microwave signals, giving rise to the bulk negative resistance.

Referring to FIG. 2, there is shown a typical d.c. current (I) vs. voltage (V) curve for one of these bulk devices. When a d.c. voltage is applied to a bar of N-type Gallium Arsenide, the current first increases linearly with voltage and then oscillates when the average electric field increases beyond a threshold field ($V_T$) of about 3 kilovolts per centimeter. In one mode of operation of these devices, the time period of oscillation is approximately equal to the transit time of the charge carriers between the two terminals of the device. Experiments with this type of mode have revealed that these current oscillations are associated with the transit of high field "domains" nucleating cyclically at one terminal and being collected at the other terminal. This transferred electron effect can be operated in several modes. A further discussion of these modes and effect may be had by reference to an article "Transferred Electron Amplifiers and Oscillators" in the *IEEE Transactions on Microwave Theory and Techniques*, November 1970, pp. 773 to 783, Vol. MTT–18, No. 11 by S. Narayan and F. Sterzer.

When these transferred electron devices and other nonlinear active semiconductor devices such as avalanche diode devices are placed in a microwave cavity and are biased appropriately, they not only operate at the fundamental frequency as discussed above, but also at even and odd harmonics of that frequency. This fundamental frequency and the harmonics thereof are determined by the circuit or the cavity in which the microwave device is located. As discussed previously, this operation of the devices at the fundamental and the even and odd harmonics thereof, lowers the conversion efficiency of these devices when converting from d.c. to a selected frequency electromagnetic wave. The efficiency can be increased together with an increase in available power by a device array in a circuit geometry that can support orthogonally coupled spacial modes which permits independent tuning of the fundamental and the even harmonics of the fundamental.

In FIG. 1, the devices 11 and 13 are arranged in the cavity 15 in series between the broad walls 17 and 19 at the center of the cavity 15. Fine threaded copper screws or diode mounts, not shown, may be used to hold the devices 11 and 13. The screws or diode mounts screw into tapped holes in the broad walls 17 and 19 of the cavity with the mounts providing adequate electrical contact to the walls of the waveguide cavity and providing adequate heat sinking for the individual devices 11 and 13.

Devices 11 and 13 are further placed in the cavity 15 such that one terminal of the device 11 is coupled to broad wall 17 and one of the terminals of device 13 is connected to the broad wall 19. The free terminals of the devices 11 and 13 are oriented toward each other and toward the center of the cavity 15. The free terminals of the devices 11 and 13 are connected by a conductive member 35. A second conductive member 36 is joined at one end to the approximate midpoint of the conductive member 35 so as to form a T-junction with member 35. Conductive member 36 extends parallel and equidistant from the broad walls 17 and 19 and perpendicular to the narrow wall 21. The member 36 is coupled at the opposite terminal end 39 to a d.c. voltage bias source (not shown) of proper polarity. The conductive member 36 is coupled through an aperture in narrow wall 21. The capacitance 38 associated with the insulative spacing between the conductive member 36 and the narrow wall 21 acts to bypass the microwave signals in the cavity from the bias source.

The rectangular waveguide cavity 15 is dimensioned such that the narrow walls 21 and 23 are about half as wide as the broad walls 17 and 19. The width of the broad walls 17 and 19 is made slightly wider than one-half a wavelength long at the desired fundamental frequency. In the above described arrangement, the rectangular waveguide cavity 15 can support electromagnetic waves at the desired operating fundamental frequency of the devices 11 and 13 in the $TE_{10}$ mode. Therefore, when electromagnetic signal waves are excited in the cavity with the arrangement described above, these signal waves at the operating fundamental frequency of the devices 11 and 13 propagate in the dominant $TE_{10}$ mode.

Referring to FIG. 3, the electric field for signal waves at the fundamental frequency in the $TE_{10}$ mode is between the broad walls 17 and 19. The value of the microwave impedance and the strength of the electric field is maximum near the center of the cavity midway between the narrow walls 21 and 23 and minimum near the narrow walls 21 and 23. Since the devices 11 and 13 are centered in the cavity between the broad walls 17 and 19, they appear in series as to these $TE_{10}$ mode waves at the fundamental frequency. At odd harmonics of the fundamental frequency the electric field strength is again maximum between the centers of the broad walls and the devices 11 and 13 appear in series.

Since the narrow walls 21 and 23 are about half as wide as the broad walls 17 and 19, the $TE_{01}$ mode second harmonic signal waves, if excited, could be supported in the cavity. Between devices 11 and 13 is the conductive member 35. As discussed previously, a conductive member 36 is joined perpendicular to this member 35 and extends parallel to the broad walls 17 and 19 and extends through the narrow wall 21 to the d.c. bias source located at terminal 39. The conductive member 36, coupled as discussed above to the junction of the devices, causes $TE_{01}$ mode signal waves to be excited in the cavity at the second harmonic of the fundamental operating frequency of the devices 11 and 13.

Referring to FIG. 4, there is illustrated the electric field of signal waves in the $TE_{01}$ mode. The electric field of $TE_{01}$ mode signal waves extends between the narrow walls 21 and 23 with the maximum electric field being at the center between the walls 17 and 19 and being at a minimum at the broad walls 17 and 19. Since the devices 11 and 13 are centered in the cavity with one device 11 at broad wall 17 and one device 13 at broad wall 19, these devices appear in parallel as to these $TE_{01}$ mode signal waves. At other even harmonics of he fundamental frequency (4th, 6th, etc.), the signal energy in the cavity is excited similarly in a mode orthogonal to that of the odd harmonics of the fundamental frequency. Also, at the even harmonics of the fundamental frequency, the electric field strength is maximum between the centers of the narrow walls and the devices 11 and 13 appear in parallel.

Since the modes associated with the fundamental and the odd harmonics are spacially orthogonal to the modes associated with the even harmonics of the fundamental, independent tuning of the fundamental and even harmonics is possible.

As shown in FIG. 1, the cavity 15 includes a resonant coupling iris 25 in the conductive end wall 26 of the cavity and a resonant coupling iris 27 in the conductive end wall 28 of the cavity 15. Coupling iris 27 is of a relatively short height $H_1$ and a relatively long width $W_1$. The height $H_1$ is made sufficiently short to prevent the second order harmonic signal waves associated with the $TE_{01}$ mode from being coupled out of the cavity 15. The width $W_1$ is made sufficiently wide so as to be more than one-half wavelength wide at the fundamental frequency to resistively couple signal waves at the fundamental frequency in the $TE_{10}$ mode of the cavity 15.

The resonant coupling iris 25 in end wall 26 has a relatively tall height $H_2$ and a relatively short width $W_2$. A waveguide section 31 having height $H_2$ and a width $W_2$ is coupled at the iris 25 as shown in FIG. 1. The section 31 is terminated by a variable transverse shorting plate 32 substantially filling waveguide 31 at the free end thereof. The height $H_2$ is dimensioned so as to couple the second harmonic signals in the $TE_{01}$ mode from the rectangular waveguide cavity 15 to the waveguide 31 and to propagate these second and other even order harmonic signals along this waveguide section. The width $W_2$ is made sufficiently narrow to reflect the fundamental $TE_{10}$ mode signal waves.

The resonant coupling iris 27 in end wall 28 of the waveguide is located at a second harmonic frequency high impedance point from the devices 11 and 13. The resonant iris 27 is located at a distance approximately $n\lambda_2/4$ away from the devices 11 and 13, where the $n\lambda_2$ is an integral multiple of wavelengths at the second harmonic frequency. Resonant coupling iris 25 is located at a fundamental frequency high impedance point away from the devices 11 and 13 so as to provide high reflective impedance at the fundamental frequency at the wall 26 of the cavity 15. The iris 25 is therefore located, for example, at a point about one-quarter wavelength at the fundamental frequency ($\lambda_0/4$) from the devices 11 and 13.

The waveguide section 31 is adapted to couple the $TE_{01}$ mode signal waves associated with second harmonic signal waves along the waveguide to the variable transverse reflecting short 32. The variable transverse reflecting short 32 is located at a relatively high impedance point from the coupling iris 25 at the second harmonic signal frequency so as to reflect the second and other even harmonic frequency signal waves back into the cavity 15. The variable transverse reflecting member 32 is located at a bout an integral number of one-quarter second harmonic frequency wavelengths from the iris 25.

In the above arrangement, when for example, sufficient d.c. electric field bias is applied from the source at terminal 39 (over the threshold, the devices 11 and 13 generate electromagnetic signal waves in both the $TE_{10}$ mode and the $TE_{01}$ mode in the cavity 15. The $TE_{10}$ mode signal waves are associated with the desired fundamental frequency of the devices 11 and 13. These fundamental frequency signal waves are coupled out of the cavity through the resonant iris 27 to a desired utilization means, not shown. The fundamental frequency signal waves in the $TE_{10}$ mode that are propagated toward wall 26 of the cavity are reflected at the iris 25 and are coupled out of the cavity through the resonant iris 27.

The $TE_{01}$ mode signal waves associated with the second harmonic of the fundamental signal frequency are reflected at the iris 27 at end 28 and are coupled back toward the devices 11 and 13. The $TE_{01}$ mode waves associated with the second harmonic are coupled through the iris 25 to the waveguide section 31. These $TE_{01}$ mode signal waves in the waveguide section 31 are reflected by the transverse short 32 and are coupled along the waveguide section 31 and the cavity 15 to the devices 11 and 13 and remain in the cavity. Other even order harmonic frequency waves in the orthogonal mode to the fundamental $TE_{10}$ mode are similarly reflected and remain in the cavity.

Additional impedance matching of the devices 11 and 13 to the cavity may be had by increasing the diameter of the conductive member 35 or the diode mounts associated with the devices 11 and 13. Additional tuning and impedance matching may be had by capacitive tuning screws such as screw 41 extending through narrow wall 23.

Where one desires that the desired output frequency be above that of the fundamental, say the second harmonic for example, the waveguide 31 is removed and the second harmonic signals are coupled out of the cavity 15 to a suitable resistive load through the iris 25. The fundamental and odd harmonic frequencies of the fundamental are reflected by a reduced height waveguide section coupled at iris 27 to cavity 15. The reduced height waveguide section is about $n\lambda_2/4$ long.

Referring to the sketch of FIG. 5, there is illustrated in cross section a waveguide cavity 44 similar to cavity 15 in FIG. 1. In this arrangement, the device 40 is adjacent to the narrow wall 41 and device 43 is adjacent to narrow wall 42. These devices 40 and 43 extend into the waveguide cavity 44 at a point midway between the broad walls 47 and 49. A conductive member 45 is coupled between the devices 40 and 43. An orthogonal member 46 is joined to the conductive member 45 at one end, and the opposite end is coupled to the d.c biasing source (not shown) at terminal 48. The conductive member 46 is coupled through an aperture in wall 47. RF bypass of microwave signals is provided by capacitor 47A. The free ends of the active devices 40 and 43 extend toward the center of the waveguide cavity 44 and toward each other as shown in FIG. 5. The cavity 44 is dimensioned as described previously to support electromagnetic waves at the operating fundamental frequency of the devices 40 and 43 in the $TE_{10}$ mode and to support electromagnetic waves at the second harmonic frequency of that fundamental in the $TE_{01}$ mode.

In the operation of a transferred electron oscillator, for example, a d.c. electric field bias above that of threshold is applied to the devices 40 and 43 along member 46. With the devices 40 and 43 oriented and biased, as shown, and the waveguide dimensioned as described previously, $TE_{01}$ mode signal waves associated with the second harmonic frequency of the fundamental frequency are excited in the waveguide cavity 44. With the aid of the conductive member 46 extending perpendicular to broad wall 47, as shown, $TE_{10}$ mode signal waves of the fundamental frequency are excited in the cavity 44. The pair of devices 40 and 43 in the arrangement of FIG. 5 appear to the $TE_{10}$ mode waves at the fundamental frequency as being in parallel and to the $TE_{01}$ mode waves at the second harmonic of the fundamental frequency as being in series.

With the same placement and dimensions of the irises at either end of the cavity 44, as shown and described in connection with FIG. 1, and the same additional waveguide section as section 31, the coupling out of the $TE_{10}$ mode waves and the reflection of the $TE_{01}$ mode waves is the same as in FIG. 1. The fundamental frequency signal waves in the $TE_{10}$ mode are reflected at one end and coupled out of the opposite end through a resonant iris oriented to couple the $TE_{10}$ mode signal waves. The excited $TE_{01}$ mode signal waves associated with the second harmonic of the fundamental frequency are reflected back into the cavity as described previously in connection with FIG. 1. Additional tuning balance is achieved by the addition of capacitive tuning screws 50 which may extend through the broad wall 49 as shown in FIG. 5.

Referring to the sketch of FIG. 6, the active devices may be placed in a series-parallel coupled arrangement as shown. FIG. 6 is a sketch of the cross section of a waveguide cavity 51 similar to that of cavity 15 of FIG. 1. The devices 55 and 57 both extend from the broad wall 74 and devices 56 and 58 both extend from broad wall 52. Conductive member 61 joins devices 55 and 56 together and conductive member 63 joins devices 57 and 58 to each other. Conductive member 59 is coupled between the midpoint of conductor 61 and one bias source (not shown) at terminal 71. Conductive member 60 is coupled between the midpoint of conductor 63 and a second bias source (not shown) at terminal 72. RF decoupling of microwave signals is provided by the capacitance 65 associated with the insulative spacing between conductive member 59 and narrow wall 53 and the capacitance 67 associated with the insulative spacing between conductive member 60 and narrow wall 54. A balancing capacitor 69 which may be in the form of a capacitive tuning probe is located between the devices 55, 56, 57 and 58 to aid in balancing the series-parallel system. With the waveguide cavity 51 dimensioned as described previously in connection with FIG. 1, the devices 55 and 56 operate in series as to the fundamental frequency signal waves in the $TE_{10}$ mode, and the devices 57 and 58 operate in series as to the fundamental frequency signal waves in the $TE_{10}$ mode. As to fundamental frequency signal waves in the $TE_{10}$ mode, the series combination of devices 55 and 56 operate in parallel to the series combination of devices 57 and 58.

The conductive members 59 and 60 aid in exciting the $TE_{01}$ mode signal waves. The devices 55 and 57 appear in series as to the second harmonic frequency waves in the $TE_{01}$ mode. Likewise, the devices 56 and 58 appear in series as to the second harmonic frequency signal waves in the $TE_{01}$ mode. The series combination of devices 55 and 57 operate as to $TE_{01}$ mode waves in parallel with the series combination of devices 56 and 58. With the resonant coupling irises on either end of the cavity as described above in connection with FIG. 1 and with the cavity being dimensioned and arranged as shown and described above in connection with FIG. 1, the coupling of the $TE_{10}$ mode fundamental signal waves out of the cavity would be achieved and the second order harmonic waves in the $TE_{01}$ mode would be reactively terminated.

While the above arrangement chose the use of transferred electron devices, other types of nonlinear active devices which exhibit a negative resistance effect, such as avalanche diodes and Schottky barrier diodes, may be effectively combined to maximize the power available at the fundamental frequency or at a selected harmonic frequency in the manner described above. In the arrangement of FIG. 1 using avalanche diodes or Schottky barrier diodes and the bias source at terminal 39 is positive, the N-terminal of each of the devices would be connected to the opposite broad walls 17 and 19 and the P-terminal of each of the devices extend toward each other and are connected to each other by conductive member 35. Although positive bias is shown in the illustration for transferred electron devices the bias source may be positive or negative.

What is claimed is:

1. In combination:

a waveguide cavity designed to support electromagnetic signal waves at a given frequency in a first mode and to support electromagnetic waves at an even harmonic frequency of said given frequency in a second mode orthogonal to said first mode, at least two negative resistance, two-terminal, nonlinear semiconductive active devices mounted within said cavity and extending from opposite walls of said cavity in a plane transverse to the direction of propagation of said electromagnetic signal waves and extending in the direction of the electric field of a selected one of said first and second modes of said signal waves whereby said active devices when properly biased act to excite within said cavity signal waves at the frequency corresponding to the selected one of said first and second modes, means associated with said active devices for causing said devices to excite within said cavity signal waves in the mode orthogonal to said selected one of said first and second modes, a first resonant iris at one end of said cavity a distance of about an integral multiple of a quarter wavelength at said even harmonic frequency away from the mounted position of said devices being dimensioned to reflect signal waves at said second mode and to couple said signal waves at said first mode out of the cavity, a second resonant iris at the end of said cavity opposite of said one end a distance of about an integral multiple of quarter wavelengths at said given frequency away from the mounted position of said devices being dimensioned to couple the signal waves at said second mode and to reflect signal waves at said first mode, a second waveguide cavity coupled to one of said irises and terminating in a reflective impedance to receive and reflect said signal waves of a predetermined one of said first and second modes back into said first mentioned waveguide cavity.

2. In combination:

a rectangular waveguide cavity designed to support electromagnetic signal waves at a given frequency in a first $TE_{10}$ mode and to support electromagnetic signal waves at an even harmonic frequency of said given frequency in a second $TE_{01}$ mode, at least two negative resistance, two terminal, nonlinear semiconductive active devices mounted within said cavity and extending from opposite walls of said cavity in a plane transverse to the direction of propagation of said electromagnetic signal waves and extending in the direction of the electric field of a selected one of said $TE_{10}$ and $TE_{01}$ modes of said signal waves whereby said active devices when properly biased act to excite within said cavity signal waves at the frequency corresponding to the selected one of said $TE_{10}$ and $TE_{01}$ modes, means associated with said active devices for causing said devices to excite within said cavity signal waves in the mode orthogonal to said selected one of said $TE_{10}$ and $TE_{01}$ modes, a first resonant iris at one end of said cavity at a distance of about an integral multiple of quarter wavelengths at said even harmonic frequency away from the mounted position of said devices having a height sufficient to reflect $TE_{01}$ mode signal waves within said cavity and a width on the order of at least one-half wavelength long at said given frequency to couple $TE_{10}$ mode signal waves, a second resonant iris at the end of said cavity opposite said one end having a height dimensioned to couple said second harmonic $TE_{01}$ mode signal waves out of said cavity and a width to reflect $TE_{10}$ mode signal waves, a second waveguide cavity coupled to said second iris and terminated in a reflective impedance located about an integral multiple of quarter wavelengths at said even harmonic frequency away from said second iris to reflect signal waves in the $TE_{01}$ mode coupled to said second waveguide cavity back into said first mentioned waveguide cavity.

3. The combination as claimed in claim 2, wherein said second iris is located at a distance of about an integral multiple of quarter wavelengths of said given frequency away from mounted position of said devices.

4. In combination:

a waveguide cavity designed to support electromagnetic signal waves at a given frequency in a first mode and to support electromagnetic signal waves at an even harmonic frequency of said given frequency in a second mode orthogonal to said first mode, at least four negative resistance, two terminal, nonlinear semiconductive active devices, a first two of said devices mounted within said cavity near a first wall of said cavity and extending from opposite second and third walls of said cavity in a plane transverse to the direction of propagation of said electromagnetic signal waves and extending in the direction of the electric field of a selected one of said first and second modes of said signal waves whereby said active devices when properly biased act to excite within said cavity signal waves at the frequency corresponding to the selected one of said first and second modes.

a second two of said active devices mounted within said cavity near a fourth wall opposite said first wall and extending from said opposite second and third walls of said cavity in a plane transverse to the direction of propagation of said electromagnetic signal waves and extending in the direction of the electric field of said selected one of said first and second modes of said signal waves whereby said active devices when properly biased act to excite within said cavity signal waves at the frequency corresponding to the selected one of said first and second modes, means associated with said active devices for causing said devices to excite within said cavity signal waves in the mode orthogonal to said selected one of said first and second modes, means for reactively terminating signal waves in a certain one of said first and second modes, and means for resistively coupling out of said cavity the signal waves in the mode orthogonal to said certain one of said first and second modes.

5. The combination as claimed in claim 4, wherein said cavity is a rectangular waveguide cavity and said first mode is a $TE_{01}$ mode and said second mode is a $TE_{01}$ mode.

6. The combination as claimed in claim 4, including balancing means coupled between said devices.

7. The combination as claimed in claim 6, wherein said balancing means is a capacitive tuning means.

* * * * *